United States Patent
Sun et al.

(10) Patent No.: US 10,785,845 B1
(45) Date of Patent: Sep. 22, 2020

(54) ELECTRONIC DEVICES WITH BACKLIT DISPLAYS

(71) Applicant: Apple Inc., Cupertino, CA (US)

(72) Inventors: Adrian E. Sun, Mountain View, CA (US); ByoungSuk Kim, Palo Alto, CA (US); Jason P. Marini, Morgan Hill, CA (US); Jun Qi, San Jose, CA (US); Kerry J. Kopp, Los Altos Hills, CA (US); Matthew W. Cooper, Cupertino, CA (US); Mingxia Gu, Campbell, CA (US); Yanming Li, Santa Clara, CA (US); Kevin J. Ryan, Mountain View, CA (US); Shmuel G. Link, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/559,480

(22) Filed: Sep. 3, 2019

Related U.S. Application Data

(60) Provisional application No. 62/852,871, filed on May 24, 2019.

(51) Int. Cl.
| H05B 33/00 | (2006.01) |
| H05B 45/50 | (2020.01) |
| H05K 5/00 | (2006.01) |
| G06F 1/16 | (2006.01) |
| H05K 5/02 | (2006.01) |

(52) U.S. Cl.
CPC ............ *H05B 45/50* (2020.01); *G06F 1/1601* (2013.01); *H05K 5/0017* (2013.01); *H05K 5/0234* (2013.01)

(58) Field of Classification Search
CPC ........ H05B 45/22; H05B 45/20; H05B 45/10; H05B 45/37; H05B 45/46; H05B 2203/036; H05B 3/34; H05B 3/342; H05B 41/295; H05B 41/36
See application file for complete search history.

(56) References Cited

U.S. PATENT DOCUMENTS

| 7,321,348 B2 | 1/2008 | Cok et al. |
| 8,508,441 B2 | 8/2013 | Kimura et al. |
| 8,937,587 B2 | 1/2015 | Nakajima |
| 9,276,766 B2 | 3/2016 | Knapp |
| 2020/0006988 A1* | 1/2020 | Leabman ................ H02J 50/80 |

\* cited by examiner

*Primary Examiner* — Monica C King
(74) *Attorney, Agent, or Firm* — Treyz Law Group, P.C.; G. Victor Treyz; Matthew R. Williams

(57) ABSTRACT

An electronic device may have a display mounted in a housing. The housing may have a stand that supports the housing on a support surface or may have other shapes. The display may have pixels that display an image. The display may also have a two-dimensional array of light-emitting devices such as light-emitting diodes that supply backlight illumination for the pixels. An array of temperature sensors may be overlapped by the pixels. Control circuitry may maintain historical backlight aging information during operation of the display. The aging information may include information on output brightness levels of the light-emitting diodes and light-emitting diode operating temperatures.

20 Claims, 5 Drawing Sheets

$$\eta = exp\left(-1 \cdot \left(\frac{1}{\tau_{ref}} \cdot \left(\left(\frac{I_{LED} \times PWM}{I_{LED\_ref}}\right)^m \times t \times \alpha^{\frac{T_{ref}-T}{10}}\right)\right)^\beta\right)$$

| | |
|---|---|
| Tref | 90046.81494 |
| α | 0.788101439 |
| β | 1.195804948 |
| $T_{ref}$ | 60 |
| m | 0 |

*FIG. 4*

ELECTRONIC DEVICES WITH BACKLIT DISPLAYS

This application claims the benefit of provisional patent application No. 62/852,871, filed May 24, 2019, which is hereby incorporated by reference herein in its entirety.

FIELD

This relates generally to electronic devices, and, more particularly, to electronic devices with displays.

BACKGROUND

Electronic devices may have displays. Displays may be used for displaying visual content for a user. Some displays have arrays of pixels that are backlit using a backlight unit. The backlight unit may contain light sources such as light-emitting diodes.

It can be challenging to ensure that a backlit display with light-emitting devices operates properly as light-emitting diodes age. Aging effects may result in degraded light output. Because aging may not occur uniformly across light-emitting diodes in a backlight, there is a risk that light output will not be uniform. This can negatively impact the quality of images on a display.

SUMMARY

An electronic device may have a display mounted in a housing. The housing may have a stand that supports the housing on a support surface or may have other shapes. The display may have pixels that display an image. The display may also have a two-dimensional array of light-emitting devices such as light-emitting diodes that supply backlight illumination for the pixels.

The light-emitting devices that supply the backlight illumination may experience reduced light output capabilities due to aging. Aging may be impacted by operating parameters such as light output level and operating temperature. During operation of the display, control circuitry in the device may track light-emitting device aging effects. Using this aging information, the control circuitry may compensate the light-emitting diodes for reduced output to ensure that backlight illumination is provided evenly to the display.

To track aging, temperature measurements may be made. An array of temperature sensors may be overlapped by the pixels. During operation, light-emitting diode operating temperatures gathered using the temperature sensors. Light output levels may also be monitored to assess aging. Light-emitting diode aging information may be processed to produce correction factors. The correction factors may be applied to the light-emitting diodes in a display so that the peak output intensity of light-emitting diodes that are not significantly aged are reduced and brought into line with the peak output intensity of significantly aged light-emitting diodes.

BRIEF DESCRIPTION OF THE DRAWINGS

FIG. 4 is a light-emitting device output efficiency equation for light-emitting devices in accordance with an embodiment.

DETAILED DESCRIPTION

An electronic device may have a display. During operation of the device, the display presents images for viewing by a user. The display may have an array of pixels such as liquid crystal display pixels or other pixels. Backlight illumination for the display may be provided by a backlight unit.

The backlight unit may be a local dimming backlight that has a two-dimensional array of individually adjustable light-emitting devices. The light sources of the backlight unit may be, for example, semiconductor light-emitting devices such as light-emitting diodes or lasers. An array of hundreds or thousands of light sources may be incorporated into the backlight unit. These light sources may be selectively adjusted during operation of the display. The ability to selectively adjust the brightness of backlight illumination across different areas of the display allows the display to exhibit enhanced dynamic range and to display high-dynamic-range images.

Figure 1:
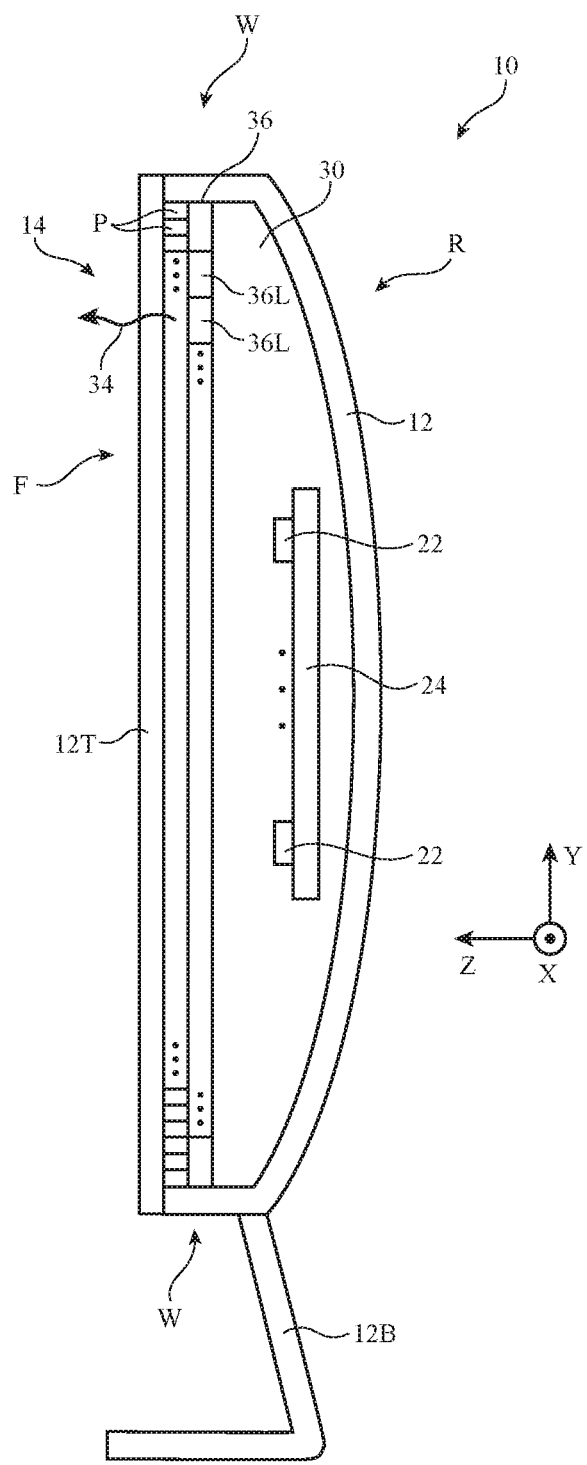
FIG. 1 is a cross-sectional side view of an illustrative electronic device with a backlit display in accordance with an embodiment.

A cross-sectional side view of an illustrative electronic device with a backlit display is shown in FIG. 1. Electronic device 10 may have a display such as display 14 mounted in a housing such as housing 12. Device 10 of FIG. 1 is a desktop device such as a desktop display with an embedded computer (e.g., a desktop computer) or a desktop display without an embedded computer. Device 10 may also be a cellular telephone, a wristwatch device, a computing device such as a laptop computer, a media player, a pendant device, a display, a gaming device, a head-mounted device, an embedded system such as a system mounted in a kiosk or automobile, or other electronic equipment.

Housing 12 may be formed from polymer, metal, glass, crystalline material such as sapphire, ceramic, fabric, fibers, fiber composite material, natural materials such as wood and cotton, other materials, and/or combinations of such materials. Housing 12 may be configured to form housing walls. The housing walls may enclose an interior region such as interior region 30 within device 10 and may separate interior region 30 from an exterior region surrounding device 10. The housing walls may include a rear wall on rear side R of device 10, sidewalls on edges W of device 10 (including the upper and lower edges W shown in FIG. 1 and left and right edges W), and a transparent housing wall 12T that serves as a display cover layer on front side F of device 10. Front side F opposes rear side R of device 10 in the illustrative configuration of FIG. 1. Stand portion 12B of housing 12 may support the main portion of housing 12 and display 14 on a desktop or other support surface. Other arrangements may be used for forming housing 12 and device 10, if desired. The arrangement of FIG. 1 is illustrative.

Display 14 may be a liquid crystal display or other suitable display. Display 14 may have an array of pixels P. The portion of housing 12 that overlaps display 14 may sometimes be referred to as a display cover layer. The display cover layer (e.g., display cover layer 12T in the example of FIG. 1) may be formed from glass, crystalline material such as sapphire, clear polymer, other transparent materials, and/or combinations of these materials. The display cover layer may be coupled to metal housing walls or other housing structures in housing 12 and may sometimes be referred to as forming transparent housing structures or a transparent housing wall.

Display cover layer 12T may overlap an active area of display 14 containing pixels P on front side F of device 10. During operation, pixels P may display an image for viewing by a user of device 10. Backlight illumination 34 for the array of pixels P may be supplied by backlight unit 36.

Backlight unit 36 may include a two-dimensional array of light sources 36L that emit backlight illumination 34 (e.g., rows of light sources 36L extending parallel to horizontal dimension X and columns of light sources 36L extending parallel to vertical dimension Y). Light sources 36 may be formed by electrical components that emit light under the control of an applied drive current. Light sources 36L may be, for example, light-emitting diodes formed from crystalline semiconductor dies or semiconductor lasers such as vertical cavity surface emitting lasers or other laser diodes. There may be any suitable number N of light sources 36L in backlight unit 36. For example, there may be 576 of light sources 36L (e.g., an array of 18 rows and 32 columns of light sources 36L). In general, the value of N may be 100-3,000, at least 300, at least 1000, at least 3,000, at least 10,000, at least 30,000, at least 50,000, fewer than 1,000,000, fewer than 300,000, fewer than 100,000, fewer than 30,000, fewer than 10,000, fewer than 3000, fewer than 1,000, or other suitable number. Light sources 36L may be arranged in horizontal rows and vertical columns or may otherwise be patterned to cover the active area associated with display 14.

During operation, backlight illumination 34 can be created only in those areas of display 14 that require backlight illumination. For example, light sources 36L may be turned off in portions of display 14 that contain only black pixels P, thereby helping to conserve power. In areas of display 14 where bright content is present (e.g., bright high-dynamic-range content), light sources 36L can be illuminated strongly. Other areas of display 14 can be provided with intermediate or low levels of backlight illumination 34 (as an example). By adjusting the intensities of each of light sources 36L in backlight unit 36 individually in this way, the dynamic range of visual content provided by display 14 can be enhanced and display power consumption can be reduced.

As shown in FIG. 1, electrical components 22 may be mounted in interior 30 of device 10 (e.g., on a substrate such as printed circuit 24 located between display cover layer 12T on front side F and an opposing rear housing wall on rear side R). Components 22 may include integrated circuits, discrete components, light-emitting components, sensors, and/or other circuits. Electrical components 22 may include control circuitry. The control circuitry may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in the control circuitry may be used to control the operation of device 10. For example, the processing circuitry may use input-output devices to gather input while using display 14 and other output devices to provide output. In some configurations, the control circuitry of device 10 may monitor the operation of display 14 (e.g., the control circuitry may gather temperature information from temperature sensors and may gather other information such as backlight light-emitting device brightness during device operation). This information may be used to adjust display 14 (e.g., to compensate components in display 14 for aging). The control circuitry of device 10 may be based on one or more microprocessors, microcontrollers, digital signal processors, baseband processors, power management units, audio chips, application specific integrated circuits, display timing controller integrated circuits (sometimes referred to as display driver circuits), etc.

The control circuitry may include wired and/or wireless communications circuitry (e.g., antennas and associated radio-frequency transceiver circuitry such as cellular telephone communications circuitry, wireless local area network communications circuitry, etc.). The communications circuitry of the control circuitry may allow device 10 to communicate with other electronic devices. For example, the control circuitry (e.g., communications circuitry in the control circuitry) may be used to allow wired and/or wireless control commands and other communications to be conveyed between devices such as cellular telephones, tablet computers, laptop computers, desktop computers, head-mounted devices, handheld controllers, wristwatch devices, other wearable devices, keyboards, computer mice, remote controls, speakers, accessory displays, accessory cameras, and/or other electronic devices. Wireless communications circuitry may, for example, wirelessly transmit control signals and other information to external equipment in response to receiving user input or other input from sensors or other devices in components 22.

Input-output circuitry in components 22 of device 10 may be used to allow data to be supplied to device 10 and to allow data to be provided from device 10 to external devices. The input-output circuitry may include input devices that gather user input and other input and may include output devices that supply visual output, audible output, or other output.

Output may be provided using status indicator lights, display 14, and other light-emitting devices, audio output devices (e.g., tone generators and/or speakers), haptic output devices (e.g., vibrators, electromagnetic actuators, piezoelectric actuators, and/or other equipment that supplies a user with haptic output), and other output devices.

The input-output circuitry of device 10 (e.g., the input-output circuitry of components 22) may include sensors. Sensors for device 10 may include temperature sensors. The temperature sensors may be, solid state temperature sensors (e.g., semiconductor temperature sensors), thermocouples, temperature sensitive resistors, or other temperature sensing components. In an illustrative configuration, temperature sensing circuitry in device 10 may be used to monitor the thermal history of display 14. Temperature sensors may, as an example, monitor the operating temperatures of light-emitting devices 36L and may use this information on assessing the amount of aging experience by each of light-emitting diodes so that corrective action may be taken when displaying images on display 14.

If desired, other sensors may be included in device 10 such as force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into a display, a two-dimensional capacitive touch sensor and/or a two-dimensional force sensor overlapping a display, and/or a touch sensor or force sensor that forms a button, trackpad, or other input device not associated with a display), and other sensors. Touch sensors for a display or for other touch components may be based on an array of capacitive touch sensor electrodes, acoustic touch sensor structures, resistive touch components, force-based touch sensor structures, a light-based touch sensor, or other suitable touch sensor arrangements. If desired, a display may have a force sensor for gathering force input (e.g., a two-dimensional force sensor may be used in gathering force input on a display).

If desired, the sensors may include optical sensors such as optical sensors that emit and detect light, ultrasonic sensors, optical touch sensors, optical proximity sensors, and/or other touch sensors and/or proximity sensors, monochromatic and color ambient light sensors in an assembly such as ambient light sensor assembly 36, image sensors, fingerprint sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors (e.g., sensors that gather position information, three-dimensional radio-frequency images, and/or other information using radar principals or other radio-frequency sensing), depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, three-dimensional sensors (e.g., time-of-flight image sensors, pairs of two-dimensional image sensors that gather three-dimensional images using binocular vision, three-dimensional structured light sensors that emit an array of infrared light beams or other structured light using arrays of lasers or other light emitters and associated optical components and that capture images of the spots created as the beams illuminate target objects, and/or other three-dimensional image sensors), facial recognition sensors based on three-dimensional image sensors, and/or other sensors.

In some configurations, components 22 may include mechanical devices for gathering input (e.g., buttons, joysticks, scrolling wheels, key pads with movable keys, keyboards with movable keys, and other devices for gathering user input). If desired, device 10 may operate in a system with keyboards, mice, and other controllers that use wired and/or wireless connections to provide the control circuitry in device 10 with input. The input supplied to device 10 from a user and/or environmental data or other data gathered by sensors in device 10 may be used in operating device 10. For example, user input may be used in selecting content to be displayed on display 14 and can be used in adjusting audio playback volume, display color cast settings, and/or display brightness settings. Display brightness may also be adjusted based on ambient light sensor readings.

Light-emitting devices 36L may be provided with reflectors to help direct backlight illumination 34 through pixels P. Optical films such as diffuser layers to reduce hotspots, light recycling structures formed from layers such as reflective polarizers and wave plates, brightness enhancement films to help collimate backlight illumination, birefringent compensation films to enhance off-axis viewing, and other optical films may be interposed between light-emitting devices 36L and pixels P.

When the control circuitry of device 10 is displaying visual content on display 14, the intensity of the backlight illumination produced by each of light-emitting devices 36L can be controlled by control signals (voltages and currents) supplied to devices 36L by the control circuitry of device 10 (e.g., by display driver circuitry in the control circuitry of device 10). As an example, a first drive current may be applied to a first of devices 36L to create backlight illumination 34 of a first intensity for a first set of pixels P in a first area of display 14, a second independently adjusted drive current that is potentially different than the first drive current may be applied to a second of devices 36L to create backlight illumination 34 of a second intensity for a second sent of pixels P in a second area of display 14, etc. In this way, a desired pattern of backlight illumination (bright areas, intermediate brightness areas, and dark areas) can be created. Backlit images are produced by adjusting the transmission of each of pixels P in the array of pixels P that overlap backlight 36.

Light-emitting devices 36L are subject to aging effects. When new, light-emitting devices 36L will produce their maximum intensity of output light at a given drive current. As light-emitting devices 36L are used in device 10, light-emitting devices 36L age and experience wear that degrades the output capabilities of light-emitting devices 36L. At a given current, an aged light-emitting device 36L will produce less backlight illumination than a new light-emitting device 36L. Wear is generally non-linear with respect to drive current. For example, light-emitting devices 36L will age more rapidly if operated at a current 2I for a duration TP than if operated at a current I for a duration 2TP. Operating temperature also affects wear. Less wear is experienced when light-emitting devices 36L are operated at lower temperature than when operated at higher temperature.

The visual content that is displayed on display 14 may cause uneven wear in light-emitting devices 36L. For example, if a bright white logo if often present in the lower right hand corner of display 14, the light-emitting devices 36L in the lower right hand corner of display 14 may be used more than other light-emitting devices 36L and may therefore wear more than other light-emitting devices 36L.

To compensate for the effects of uneven wear, the wear (aging) of each of light-emitting devices 36L can be tracked by the control circuitry of device 10. During image playback, device 10 can provide light-emitting devices that are weakened due to age with appropriately strengthen drive signals relative to light-emitting devices that are not weakened. As an example, the brightness levels of the less worn light-emitting devices 36L in backlight unit 36 may be reduced to bring the performance of these devices 36L into line with the aged and weaker devices 36L in backlight unit 36. This evens out the light output capabilities of backlight unit 36 across display 14.

Wear tracking may involve monitoring the temperature of each of devices 36L in backlight unit 36 while simultaneously gathering information on the light output history (intensity and duration) for each of devices 36L. Running averages of operating conditions (e.g., average operating power, average temperature, etc.) may be gathered and processed by the device 10. Device 10 can then produce compensating weighting factors (sometimes referred to as correction factors) to use when providing devices 36L with control signals. Light-emitting device aging compensation information (e.g., correction factors, etc.) may be stored in non-volatile memory so that this information is retained even in the event of power interruptions.

Figure 2:
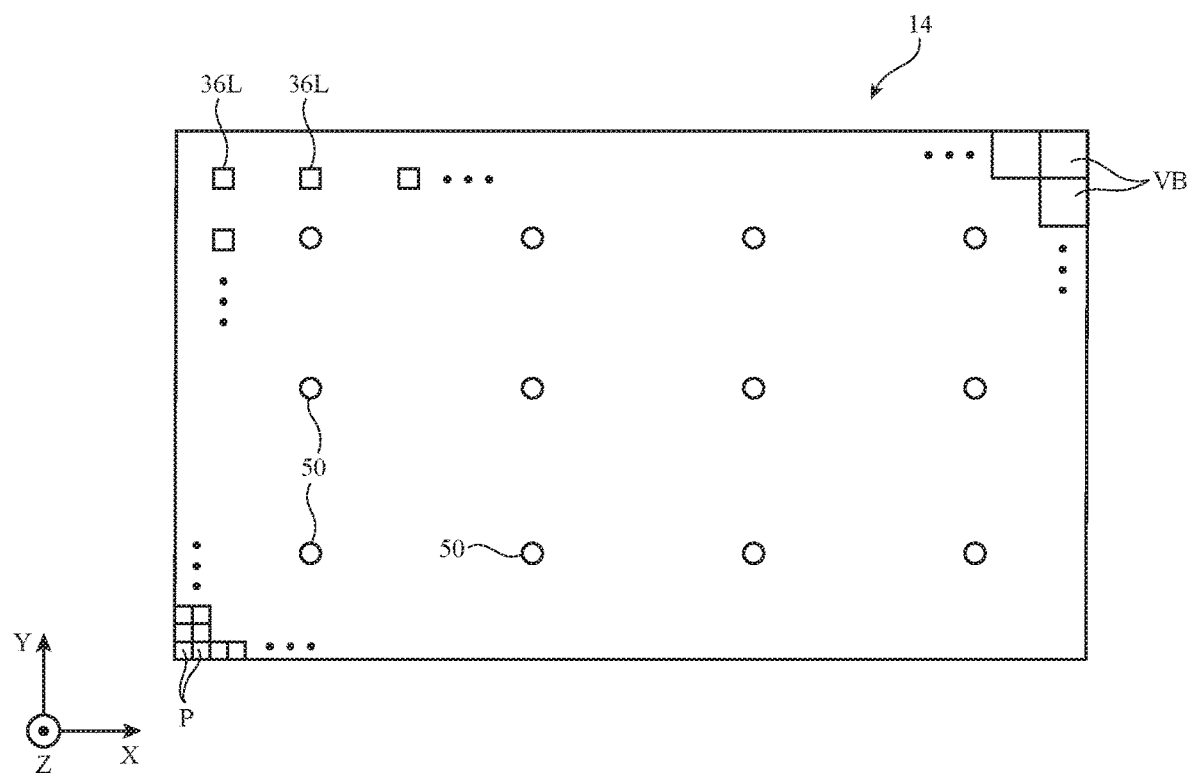
FIG. 2 is a front view of an illustrative display in accordance with an embodiment.

FIG. 2 is a front view of an illustrative display for device 10. As shown in FIG. 2, display 14 has an array of pixels P. Pixels P may be arranged in rows and columns. During operation, pixels P in device 10 display an image for viewing by a user. Backlight for the image formed from pixels P is provided by backlight unit 36. Backlight unit 36 has an array of light-emitting devices 36L overlapped by the pixel array. An array of temperature sensors 50 is overlapped by the array of light-emitting devices 36L and pixels P. Temperature sensors 50 may be arranged in an array of rows and columns and/or temperature sensors 50 may be arranged in other patterns. The area of display 14 may be subdivided into subregions VB. As shown in FIG. 2, for example, an array of display subregions such as subregions VB may overlap and cover display 14. Using temperature measurements from temperature sensors 50, device 10 can determine the temperature in each of display subregions VB.

There may be any suitable number of pixels P in display 14. For example, there may be at least 1000, at least 10,000, at least 100,000, at least 1,000,000, fewer than 1 billion, fewer than 100,000,000, fewer than 10,000,000, fewer than 2,000,000, or other suitable number of pixels in display 14.

There may be fewer light-emitting devices 36L in backlight unit 36 than pixels P in display 14. For example, there may be hundreds or thousands of rows of pixels P and hundreds or thousands of columns of pixels P in the pixel array, whereas backlight unit 36 may have 500-600 light-emitting devices 36L, 100-3,000 light-emitting devices 36L, at least 300 light-emitting devices 36L, fewer than 1000 light-emitting devices 36L, or other suitable number of light-emitting devices 36L. Light-emitting devices 36L may be arranged in horizontal rows and vertical columns or may otherwise be patterned to cover display 14.

There may be any suitable number of temperature sensors 50 in the array of temperature sensors in display 14. As an example, there may be 2-20, 5-15, at least 2, at least three, at least four, at least 5, at least 100, fewer than 20, fewer than 300, or other suitable number of rows of temperature sensors 50 in display 14 and 2-10, at least 2, at least 3, at least 4, at least five, at least 10, at least 100, fewer than 300, fewer than 15, fewer than 6, or other suitable number of columns of temperature sensors 50 in display 14. The array of temperature sensors 50 may, if desired, have a staggered layout in which some of temperature sensors 50 in the rows and columns of the array are shifted slightly from their expected horizontal and/or vertical positions or may have a regular pattern in which each temperature sensor lies at the intersection of a horizontal row axis and vertical column axis.

There may be any suitable number of subregions VB overlapping display 14 (e.g., at least 10, at least 50, 70, at least 200, fewer than 300, fewer than 150, fewer than 100, or other suitable number). Subregions VB may be rectangular or may have other suitable shapes. Subregions VB may have the same size and shape or different subregions VB may have different sizes and/or different shapes. As an example, subregions VB may contain rectangles of multiple different sizes. In an illustrative configuration, there may be more subregions VB than temperature sensors 50. There may be, for example, 12 temperature sensors and 70 subregions VB.

To ensure that display 14 is backlit as desired, light-emitting devices 36L may be provided with drive signals that reflect the amount of aging experienced by the light-emitting devices. In particular, to ensure that devices 36L that have aged less (and therefore have relatively larger output efficiencies) are not overly bright relative to devices 36L that have aged more (and therefore have relatively lower output efficiencies), the peak output allowed from the unaged devices may be reduced by an amount appropriate to bring the unaged devices into line with the aged devices. Aging can be tracked on a per-device basis and aging history information can be updated continuously during operation of device 10.

Aging is affected by how strongly light-emitting devices 36L are operated and operating temperature. Higher operating powers cause devices 36L to age faster and higher operating temperatures cause devices 36L to age faster. Accordingly, during operation of device 10, the control circuitry of device 10 can monitor operating power and operating temperature and can maintain a running history of these aging effects. When it is desired to supply backlight illumination for an image displayed by the pixels of display 14, the strengths of the drive signals to the light-emitting devices can be adjusted to accommodate the light-emitting diodes with reduced efficiencies.

Figure 3:
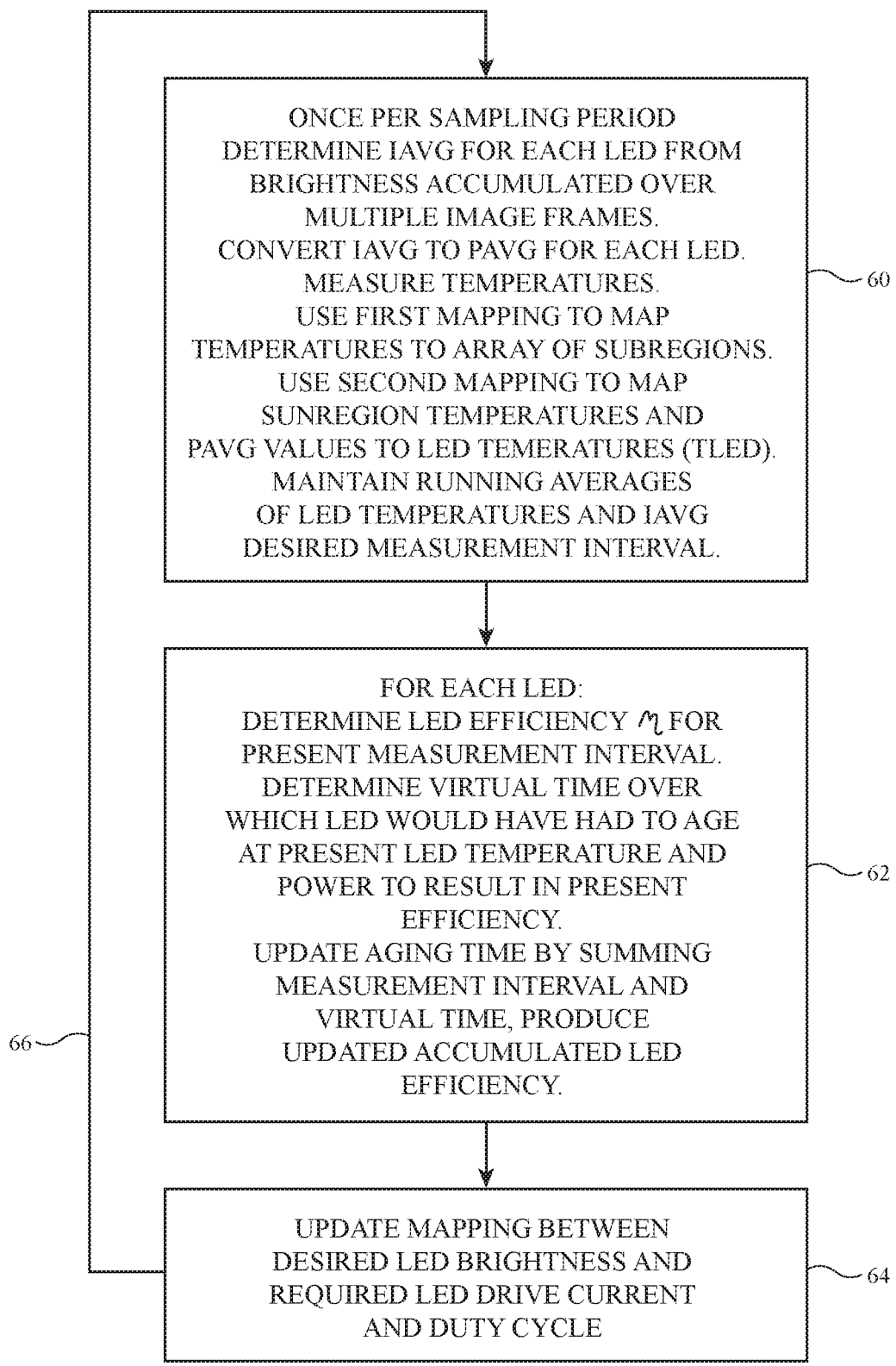
FIG. 3 is a flow chart of illustrative operations involved in measuring backlight temperatures to track the thermal history of backlight light-emitting devices and thereby compensate for aging effects in accordance with an embodiment.

Illustrative operations associated with tracking aging effects during operation of display 14 are shown in FIG. 3.

During the operations of block 60, the control circuitry of device 10 may measure operating parameters associated with backlight unit 36. Digital samples may be acquired (sampled) over multiple sampling periods. As an example, a series of samples may be acquired over a measurement period. Samples may be acquired once per second or at any other suitable sampling rate for the duration of the measurement period. The measurement period over which the samples are acquired may be 15 minutes, at least 5 minutes, less than 30 minutes, or other suitable measurement interval. During each sample, the control circuitry of device 10 may measure the current IAVG for each light-emitting device 36L (e.g., for each light-emitting diode in a configuration in which devices 36L are light-emitting diodes). The measured current IAVG for each sample may, if desired, be determined by evaluating the digital brightness value for a given device 36L over a series of image frames. The brightness value for determining the sample value IAVG for a given device 36L may, as an example, be accumulated digitally over 60 frames in a scenario in which display 14 is being operated at 60 frames per second. In some embodiments, lower output light intensities (intensities less than a threshold amount) are produced by devices 36L in display 14 by imposing variable amounts of pulse-width modulation (PWM) on a fixed light-emitting device drive current, whereas higher output light intensities are produced by devices 36L using a variable current scheme. In a PWM scheme, which is appropriate for lower output intensities, the duty cycle of the drive signal is varied to vary light output. In a variable current scheme, which is appropriate for higher output intensities, current magnitude is varied without altering duty cycle. The value of IAVG can be determined by a display driver circuitry or other circuitry in the control circuitry of device 10 based on knowledge of the PWM (duty cycle) setting and peak current for the light-emitting device 36L.

The relationship between IAVG and average power PAVG (which is affected by both the operating current and operating voltage for each light-emitting device 36L) may be determined during characterization measurements made during manufacturing (e.g., representative devices may be tested to determine the functional relationship between IAVG and PAVG for each device 36L in device 10). This predetermined relationship for each light-emitting device 36L (e.g., the mapping between IAVG and PAVG) may be stored in a look-up table maintained by a digital microcontroller or other control circuitry in device 10. During the operations of block 60, the look-up table may be used to determine PAVG for each device 36L from the known value of IAVG for each device 36L (e.g., the known value of IAVG obtained by summing brightness levels for each device 36L over the image frames of the sampling period).

Using temperature sensor measurements and the average operating power PAVG for each of devices 36L, the operating temperatures of devices 36L may be determined. In particular, the control circuitry of device 10 can gather temperature measurements from each of temperature sensors 50 and can use first and second mappings to determine the operating temperature of each of devices 36L from these temperature measurements and the values of PAVG.

In the first mapping, the temperatures gathered from each of sensors 50 are mapped to the temperatures TVB of display subregions VB. In performing this mapping, K equations such as equation (1) may be used for each of the K subregions VB in display 14.

$$TVB(i)=W1*T1+W2*T2\ldots+WM*TM+\text{CONST} \quad (1)$$

In equation 1, there are M temperature sensors that produce corresponding temperature measurements T1 . . . TM. The temperature TVB(i) of the ith subregion VB(i) is based on a summation of weighted temperature measurements, where weights W1 . . . WM and constant CONST are determined empirically and stored in the control circuitry of device 10 during manufacturing.

In the second mapping, which is represented by equation (2), the temperatures TVB for the subregions are mapped to individual temperatures for light-emitting devices 36L (i.e., temperatures TVB are mapped to light-emitting device temperatures TLED(j), where j=1 to the total number N of light-emitting devices 36L in backlight unit 36).

$$TLED(j)=TVB(i)+k*PLED(i) \quad (2)$$

In equation 2, the temperature of the jth light-emitting device 36L is determined by the temperature of the subregion in which the jth LED resides (the ith subregion in this example), a predetermined constant k, and the power of the jth light-emitting device 36L. Using this approach, the temperature associated with each light-emitting device in a given subregion VB is apportioned between the light-emitting devices in that subregion in proportion to its power.

The control circuitry of device 10 can maintain running averages of the values of TLED and IAVG over the desired measurement interval (e.g., 15 minutes, at least 1 minute, at least 10 minutes, less than 1 day, less than 1 hour, or other suitable time period).

During the operations of block 62, the impact of the aging effects measured during block 60 may be used to update a running value that is being maintained of the output efficiency ($\eta$) of each light-emitting device 36L. The measurements of the most recent measurement interval that are associated with block 60 indicate how much aging has occurred during the most recent interval. To combine the aging effects of the most recent measurement interval with the aging effects experienced over all prior measurement intervals, the control circuitry of device 10 can perform normalization and combining operations during the operations of block 62 (e.g., the control circuitry can normalize a historically accumulated efficiency ($\eta$-historical) to match the efficiency of the present measurement interval ($\eta$-present).

In particular, the control circuitry can: (a) determine the present interval efficiency $\eta$-present of each light-emitting device 36L resulting from the aging measured during the present measurement interval using the equation of FIG. 4, (b) determine a virtual time period t-virtual over which each light-emitting device 36L would have had to have aged at the present measurement interval's temperature and power values for that light-emitting device to exhibit its historically accumulated efficiency ($\eta$-historical), thereby effectively removing the temperature and power variables and allowing addition of the present aging effects to the historical aging effects. The control circuitry can then: (c) determine an updated aging time t-updated by adding the present measurement interval time (t-measurement-interval) to the value of t-virtual. After computing the value of t-updated, the efficiency equation of FIG. 4 can then (d) be reapplied using the present temperature TLED, current (IAVG), and time t-updated. This reapplication of the efficiency equation produces the correct present value of efficiency $\eta$ for each light-emitting device 36L.

During the operations of block 64, the values of $\eta$ that have been obtained for the light-emitting devices 36L of backlight unit 36 may be analyzed to produce compensation information. In particular, the maximum difference in efficiency ($\Delta\eta$) across all of the light-emitting devices 36L can be identified. If the value of $\Delta\eta$ is below a predetermined threshold, no corrective action need be taken. If, however, the value of $\Delta\eta$ is above the predetermined threshold, a correction factor R(j) can be applied to each of the j light-emitting devices 36L, where R(j) is the ratio between the efficiency of the least efficient light-emitting device and the efficiency of light-emitting device j (e.g., instead of driving a particular LED to output brightness level BL, the LED may be driven to output brightness level R*BL). By reducing the light output of the more efficient light-emitting devices 36L relative to the less efficient light-emitting devices 36L, aging-induced backlight illumination variations can be minimized or eliminated across display 14. The values of R(j) can be stored in non-volatile memory for use by display driver circuitry in device 10 when displaying content on display 14. The R(j) information may, if desired, be incorporated into a display driver circuit map (sometimes referred to as a timing controller map or TCON map) that maps desired light-emitting device brightness for each light-emitting device 36L to a corresponding current and PWM setting to be applied to that light-emitting device 36L to produce that desired brightness.

As indicated by line 66, the operations of blocks 60, 62, and 64 may be performed continuously to track potentially non-linear aging effects across all of the light-emitting devices 36L in backlight unit 36 during operation of device 10.

Figure 5:
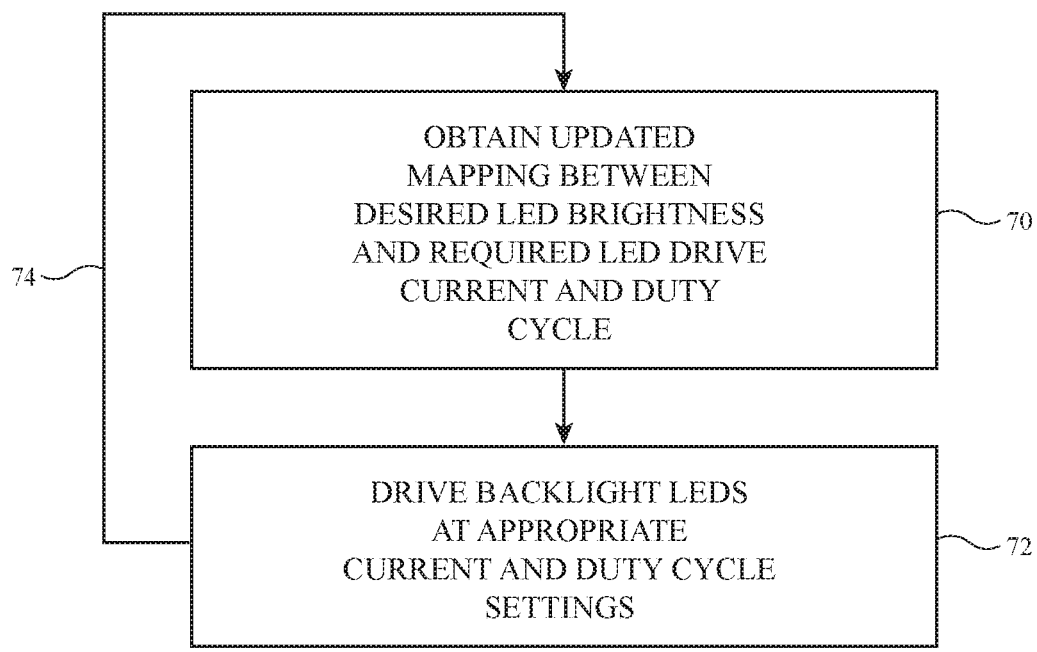
FIG. 5 is a flow chart of illustrative operations involved in operating a display while compensating a backlight for light-emitting device aging effects in accordance with an embodiment.

FIG. 5 is a flow chart of illustrative operations involved in displaying an image on display 14. During the operations of block 70, the control circuitry of device 10 (e.g., display driver circuitry that is displaying content on display 14) obtains an updated mapping (e.g., an updated TCON map) between desired light-emitting device brightness values and corresponding light-emitting device drive currents and duty cycles (PWM settings) to be used to achieve those brightness values.

During the operations of block 72, the control circuitry may drive the light-emitting devices 36L of backlight unit 36 at appropriate currents and duty cycles to produce backlight illumination of the desired magnitudes while simultaneously controlling pixels P to display a desired image that is backlit by the backlight illumination. This process may be performed continuously (e.g., to display time-varying images, video, etc.), as indicated by line 74.

Device 10 may be operated in a system that uses personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing is merely illustrative and various modifications can be made to the described embodiments. The foregoing embodiments may be implemented individually or in any combination.

What is claimed is:

1. An electronic device, comprising:
a housing;
a display in the housing that is configured to display an image, wherein the display includes:
pixels;
temperature sensors; and
individually adjustable light-emitting devices configured to produce backlight illumination for the pixels; and
control circuitry configured to use temperature measurements from the temperature sensors in compensating the light-emitting devices for aging.

2. The electronic device defined in claim 1 wherein the temperature sensors form a two-dimensional array of temperature sensors having rows and columns that are overlapped by the pixels.

3. The electronic device defined in claim 2 wherein the display has more pixels than light-emitting devices and has more light-emitting devices than temperature sensors.

4. The electronic device defined in claim 3 wherein the control circuitry is configured to:
maintain light-emitting device brightness history information on the light-emitting devices; and
produce correction factors for each of the light-emitting devices based on the light-emitting device brightness history information and the temperature measurements.

5. The electronic device defined in claim 1 wherein the control circuitry is configured to map the temperature measurements associated with the temperature sensors to a set of subregion temperatures associated with a respective set of subregions of the display.

6. The electronic device defined in claim 5 wherein the control circuitry is configured to map the subregion temperatures to individual temperatures for the light-emitting devices.

7. The electronic device defined in claim 6 wherein the display has more of the subregions than the temperature sensors.

8. The electronic device defined in claim 7 wherein the display has more light-emitting devices than the subregions.

9. The electronic device defined in claim 8 wherein the display comprises at least ten temperature sensors that are arranged to form rows and columns in a two-dimensional array of temperature sensors.

10. The electronic device defined in claim 1 wherein the housing has a stand configured to support the display on a surface.

11. The electronic device defined in claim 10 wherein the light-emitting devices comprise light-emitting diodes.

12. A display system, comprising:
pixels configured to display an image;
a two-dimensional array of light-emitting devices configured to produce backlight illumination for the array of pixels;
a two-dimensional array of temperature sensors overlapped by the pixels; and
control circuitry configured to gather temperature measurements from the two-dimensional array of temperature sensors and configured to produce correction factors that reduce light output of at least a first of the light-emitting devices relative to at least a second of the light-emitting devices based at least partly on the temperature measurements.

13. The display system defined in claim 12 wherein the control circuitry is configured to maintain historical information on light output from each of the light-emitting devices.

14. The display system defined in claim 13 wherein the control circuitry is configured to use the historical information on the light output and the temperature measurements in producing the correction factors.

15. The display system defined in claim 14 wherein the control circuitry is configured to:
use a first mapping to map the temperature measurements associated with the temperature sensors to a set of subregion temperatures associated with a respective set of subregions of the display; and
use a second mapping to map the subregion temperatures to individual temperatures for the light-emitting devices.

16. The display system defined in claim 15 wherein the set of subregions comprises at least 50 subregions and wherein the display has fewer subregions than pixels.

17. The display system defined in claim 15 wherein the two-dimensional array of temperature sensors comprises at least three rows and at least four columns of temperature sensors.

18. A desktop computer, comprising:
a housing with a stand configured to support the housing on a surface;
a display mounted in the housing, wherein the display comprises:
pixels configured to display an image;
a two-dimensional array of temperature sensors comprising at least two rows and at least three columns;
a two-dimensional array of light-emitting diodes configured to provide backlight illumination for the pixels; and
control circuitry configured to adjust the two-dimensional array of light-emitting diodes at least partly based on light-emitting diode aging history information gathered at least partly using the temperature sensors.

19. The desktop computer defined in claim 18 wherein the control circuitry is configured to monitor light-emitting diode output brightness levels for the two-dimensional array of light-emitting diodes and wherein the light-emitting diode aging history information is based at least partly on the light-emitting diode output brightness levels.

20. The desktop computer defined in claim 19 wherein the two-dimensional array of temperature sensors comprises at least three rows and at least four columns of temperature sensors and wherein the control circuitry is configured to map temperature sensor information from the two-dimensional array of temperature sensors to individual light-emitting diode temperatures associated with each of the light-emitting diodes in the two-dimensional array of light-emitting diodes.

* * * * *